(12) United States Patent
Chinthavali (10) Patent No.: US 8,553,414 B2
(45) Date of Patent: Oct. 8, 2013

(54) GAS COOLED TRACTION DRIVE INVERTER

(75) Inventor: Madhu Sudhan Chinthavali, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 163 days.

(21) Appl. No.: 13/312,548

(22) Filed: Dec. 6, 2011

(65) Prior Publication Data

US 2012/0140539 A1   Jun. 7, 2012

Related U.S. Application Data

(60) Provisional application No. 61/420,451, filed on Dec. 7, 2010.

(51) Int. Cl.
*H05K 7/20* (2006.01)

(52) U.S. Cl.
USPC ........... 361/697; 361/695; 361/704; 361/714; 361/720; 363/141

(58) Field of Classification Search
USPC ................ 361/694–695, 697, 703–704, 714, 361/715, 720; 165/185; 363/141
See application file for complete search history.

(56) References Cited

U.S. PATENT DOCUMENTS

| | | | |
|---|---|---|---|
| 5,546,273 A * | 8/1996 | Harris | 361/697 |
| 6,741,466 B1 * | 5/2004 | Lebo | 361/679.01 |
| 7,306,028 B2 * | 12/2007 | Zuo et al. | 165/104.26 |
| 8,304,942 B2 * | 11/2012 | Yamasaki et al. | 310/64 |
| 8,363,412 B2 * | 1/2013 | Budai | 361/720 |
| 2002/0036889 A1 * | 3/2002 | Ruiz-Gomez et al. | 361/695 |
| 2008/0186751 A1 * | 8/2008 | Tokuyama et al. | 363/131 |

* cited by examiner

*Primary Examiner* — Robert J Hoffberg
(74) *Attorney, Agent, or Firm* — Warner Norcross & Judd LLP (57) ABSTRACT

The present invention provides a modular circuit card configuration for distributing heat among a plurality of circuit cards. Each circuit card includes a housing adapted to dissipate heat in response to gas flow over the housing. In one aspect, a gas-cooled inverter includes a plurality of inverter circuit cards, and a plurality of circuit card housings, each of which encloses one of the plurality of inverter cards.

15 Claims, 10 Drawing Sheets

GAS COOLED TRACTION DRIVE INVERTER

This application claims the benefit of U.S. Provisional Application No. 61/420,451, filed Dec. 7, 2010, the disclosure of which is hereby incorporated by reference in its entirety.

This invention was made with government support under Contract No. DE-AC05-00OR22725 awarded by the U.S. Department of Energy. The government has certain rights in the invention.

BACKGROUND OF THE INVENTION

Inverters have been used in a wide variety of applications to convert a direct current (DC) energy source to an alternating current (AC) energy source. One such application involves using an inverter within an electric or hybrid-electric vehicle to convert DC power to AC power, which is applied to an electric motor for traction. Inverters that provide power for traction are sometimes described as traction inverters.

A typical inverter topology for converting DC power to AC power includes one or more inverter switches and diodes, which are switched on and off with respect to each other to yield an AC power output. Inverters used in high power and high temperature applications, such as traction inverters, have employed wide bandgap ("WBG") semi-conductors for the inverter switches and diodes. WBG semi-conductors are often utilized in high power and high temperature configurations because of their low thermal resistance, which allows for improved cooling.

In order to model the power dissipation in the electronic components in an inverter, steady-state power dissipation equations have been developed by Oak Ridge National Laboratory National Transportation Research Center for Si and SiC semi-conductor devices, a type of WBG semi-conductor, currently used in traction inverters for hybrid-electric vehicles. The power dissipation in the devices may be a function of the electrical resistance based on junction temperature, applied current, and applied voltage. The study revealed that despite the improved cooling characteristics of WBG semi-conductors, conventional inverters may be exceeding the operating parameters, such as temperature, of the WBG semi-conductors. Cooling strategies such as direct cooling with air or indirect cooling with liquid have been used in conventional inverters.

Direct cooling an inverter with air involves passing air directly over thermal energy sources, such as the packaged inverter semi-conductors. Exposure to the main flow of the coolant may create a risk of dielectric breakdown that could cause a short circuit due to accumulation of matter (e.g., dust) on the thermal energy sources and their associated DBC traces.

Indirect liquid-cooled inverters use a silicone gel to protect the sensitive power electronic devices, such as the inverter semi-conductors and their connections, from direct contact with the liquid. A drawback of a liquid-cooled system is that there is a potential for coolant leaks, which result in the electrical connections being shorted. Further, there is the added complexity, cost, space, and power consumption of the liquid-cooling system. Lastly, using silicone gel over the power electronics may prevent direct cooling.

Accordingly, there remains a need for an improved system and method for cooling inverter circuitry. In particular, there remains a need for an improved system and method for gas cooling inverter cards.

SUMMARY OF THE INVENTION

The present invention provides a circuit card configuration for distributing heat among a plurality of circuit cards. Each circuit card includes a housing adapted to dissipate heat in response to gas flow over the housing.

According to an aspect of the invention, a gas-cooled converter includes a plurality of converter circuit cards, and a plurality of circuit card housings, each of which encloses one of the plurality of inverter cards. The circuit cards are adapted to operate together to convert a power input to at least one power output, and the plurality of housings are adapted to dissipate heat from the inverter circuit cards in response to gas flowing over the plurality of housings.

In one embodiment, the gas-cooled converter includes a cylindrical housing having a central axis and a mounting surface for mounting a cylindrical capacitor. Each of the plurality of circuit card housings is mounted to the capacitor in a spaced apart configuration such that the circuit card housings are spaced around the capacitor and extend radially outward from the central axis of the cylindrical housing. Further, gas may flow in an axial direction through the cylindrical housing and generally aligned with the central axis.

In another embodiment, the gas-cooled converter includes a rectangular enclosure having a mounting surface for mounting a plurality of circuit card housings in a spaced apart configuration forming a series of gas coolant channels.

In yet another embodiment, the gas-cooled converter includes a thermal barrier adapted to prevent heat transfer from a heat source to the plurality of circuit card housings. For example, if the gas-cooled converter is coupled to a vehicle, the thermal barrier may prevent conductive heat transfer from the vehicle to the converter cards through the gas-cooled converter.

According to another aspect of the invention, a circuit component includes a modular circuit card adapted to form a part of a system of circuit cards for producing an output. The modular circuit card is interchangeable with the circuit cards of the system, and is enclosed within a card housing in a clamshell configuration. The card housing is adapted to dissipate heat from the modular circuit card in response to gas flowing over the card housing. In one embodiment of this aspect, the system of circuit cards forms a traction inverter for powering an electric motor of a vehicle.

According to yet another aspect of the invention, a traction inverter includes a plurality of modular inverter circuit cards, and a plurality of circuit card housings having heat transfer features. The plurality of modular inverter circuit cards are adapted to operate together to supply AC power to an electric motor in a vehicle, and are interchangeable with each other. For example, if one modular inverter circuit card is interchanged with another modular inverter circuit card, the traction inverter produces a substantially similar supply of AC power. Each of the circuit card housings enclose one of the plurality of modular inverter circuit cards in a clam shell configuration in order to improve convective heat transfer between each modular inverter circuit card and a gas coolant stream.

These and other features and advantages of the present invention will become apparent from the following description of the invention, when viewed in accordance with the accompanying drawings and appended claims.

DETAILED DESCRIPTION OF THE CURRENT EMBODIMENT

The invention as contemplated and disclosed herein includes systems and methods for gas cooling circuitry, and in particular improving convective air cooling for inverter and inverter device cards. Although described in the context of an inverter and inverter device cards, the present invention is well suited for use in essentially any application where improved cooling of circuitry and circuit cards is desired.

Figure 1:
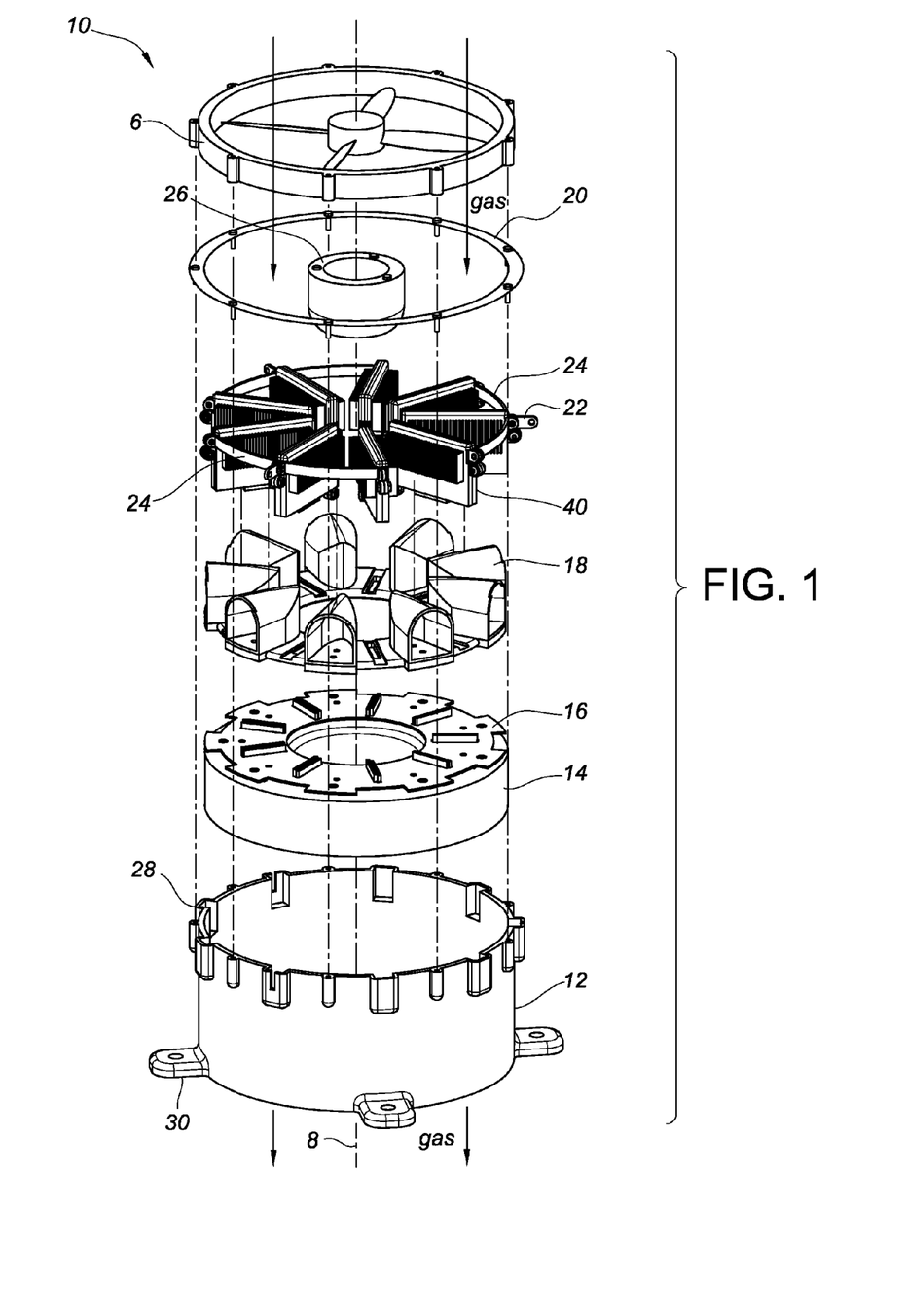
FIG. 1 is an exploded view of an annular inverter according to a current embodiment.
Figure 5:
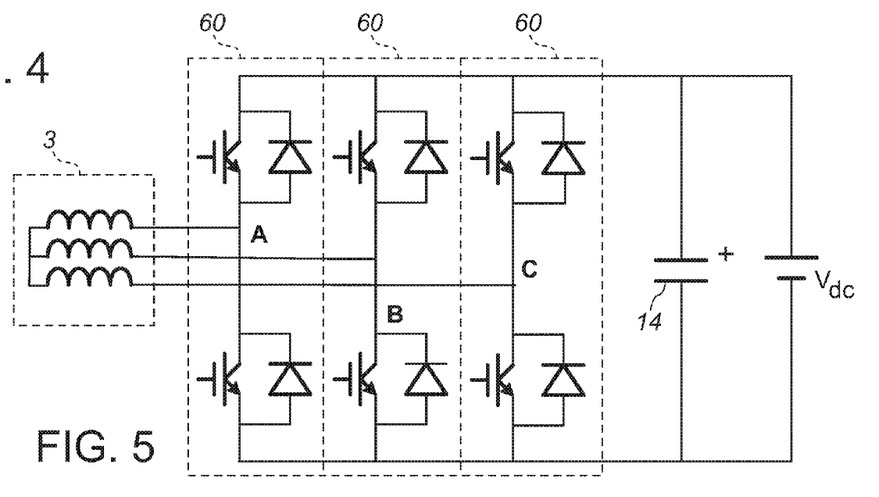
FIG. 5 is an illustration of the circuit topology of each phase leg according to the current embodiment.
Figure 11:
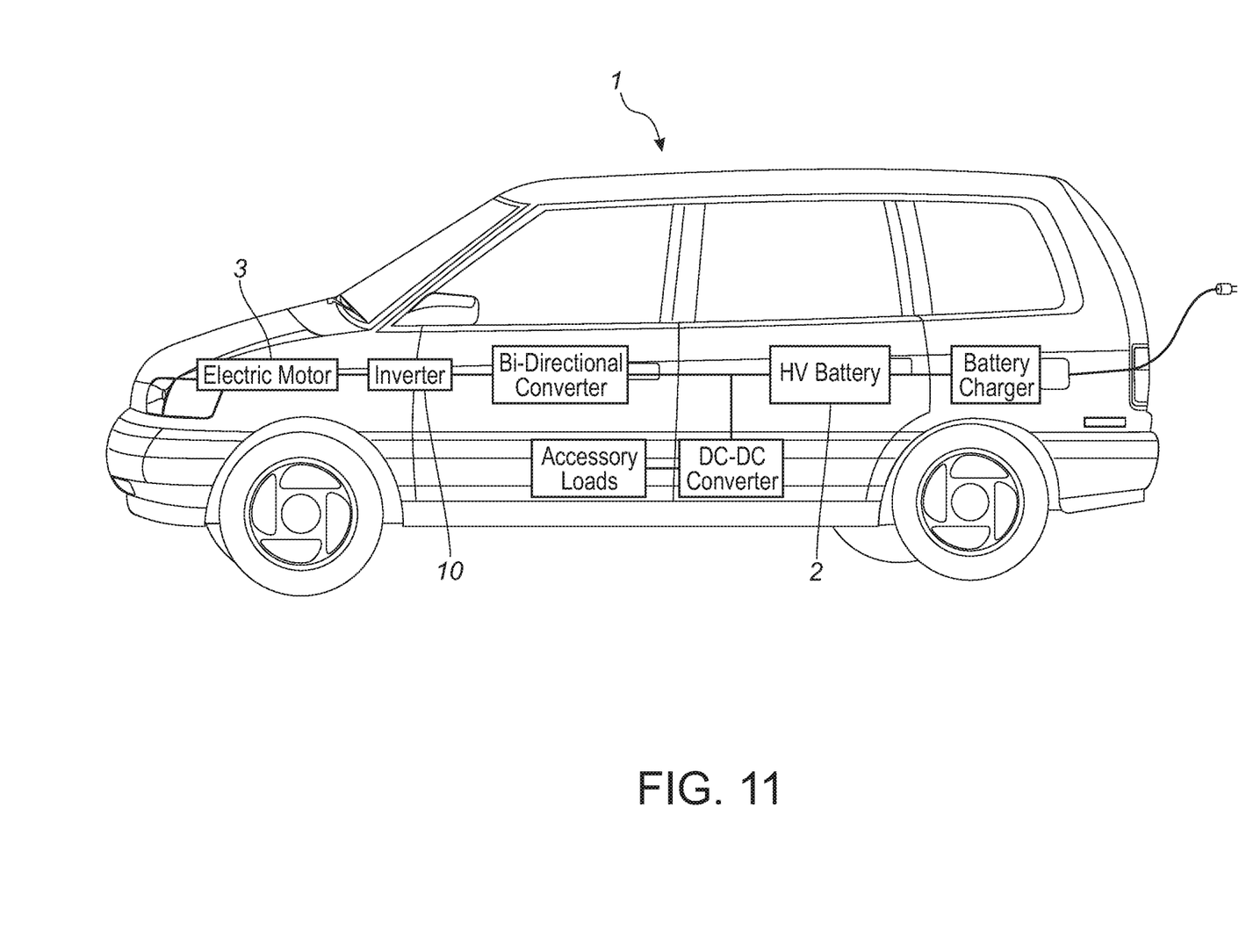
FIG. 11 is a representative view of an inverter according to the current embodiment in a vehicle.

Referring to FIGS. 1, 5, and 11, the numeral 10 generally designates an inverter of the present invention. The inverter 10 has a generally annular structure that may be assembled from the bottom up, and designed such that coolant gas flows axially, entering from the top 28 of the inverter 10 and exiting out the bottom 30 of the inverter 10. In the illustrated embodiment of FIG. 11, the inverter 10 is placed in a vehicle 1 and converts DC power from a battery 2 into AC power for driving electric motor 3.

The inverter 10 has a central vertical axis 8, and as will be described in further detail, may include an inverter housing 12, a capacitor 14, a thermal barrier 16, flow guides 18, inverter cards 40, a fan mount 20, phase out external connectors 22, phase out card connectors 24, and a fan mount center hub 26. In the current embodiment, components of the inverter 10 are primarily formed of aluminum; however, in alternative embodiments, one or more of the inverter 10 components may be formed of other materials—e.g., iron, steel, magnesium, plastics, reinforced polymers, or any other structural material. Further, a component of the inverter 10 may be formed of a combination of materials, each having different properties.

For purposes of disclosure, the inverter 10 is described in connection with multiple inverter cards 40 configured in a three-phase inverter topology. Although described in the context of inverter 10, in alternative embodiments, the inverter 10 may any type of a converter with circuitry suitable for power conversion, such as AC power to AC power, AC power to DC power, DC power to AC power, and DC power to DC power. Further, the inverter 10 may provide a single power output or multiple power outputs depending on the application. It should be appreciated that the described cooling features may be applicable to cooling any type of circuitry.

In the current embodiment, the inverter 10 may have three phase legs corresponding to three external connectors 22, each of which may be connected to one of three terminals of a load, such as an electric motor in a vehicle, in order to provide three-phase AC power to the load. The three external connectors 22 may protrude outwards from the inverter 10, and may be spaced around the inverter 10 at approximately 120° with respect to one another.

Each external connector 22 may be electrically connected to three inverter cards 40 via phase out card connectors 24. In other words, there are three inverter cards 40 per phase leg 60, yielding a total of nine inverter cards 40 for the three phase legs 60, and one external connector 22 per phase leg 60. Each of the three inverter cards 40 per phase leg 60 may be electrically connected to one of the external connectors 22 via phase out card connectors 24.

A set of external gate connections 46 for each inverter card 40 may connect to gate drive circuitry (not shown) located within the fan mount center hub 26. The inverter configuration may utilize the additional space available within the fan mount center hub 26 for current sensors and gate drivers (not shown) for controlling operation of the inverter cards 40. Alternatively, the gate drive circuitry (not shown) may be outside the inverter 10. The gate drive circuitry may control the timing of the switches for each inverter card 40 within each phase leg 60 to produce three phase power for the electric motor 3.

The size and shape of the inverter 10 and the inverter housing 12 may vary, as desired, according to design parameters, such as size constraints, component sizes, power output requirements, and desired cooling. In the current embodiment, the inverter housing 12 contains the components of the inverter 10, and has an outer diameter of 9.4 inches (239 mm) and a height of 4.5 inches (115 mm), yielding a total volume of 313 cubic inches (5.1 liters) for the inverter 10. In alternative embodiments, the outer diameter of the inverter 10 may vary at least from 3 inches to 20 inches, and the height of the inverter 10 may vary at least from 2 inches to 10 inches.

As discussed previously, the inverter 10 of the current embodiment includes a gas inlet near the top 28 of the inverter 10 and a gas exit near the bottom 30 of the inverter 10, both allowing for axial flow of gas through the inverter 10. The size of the gas inlet near the top 28 and the size of the gas exit near the bottom 30 may also vary, as desired, according to design parameters. As illustrated, the area of gas inlet near the top 28 covers the entire surface of the inverter 10, excluding the fan mount center hub 26. The gas exit diameter at the bottom 30 of the inverter 10 is approximately 4 inches (100 mm) and is not visible in FIG. 1. The gas exit diameter may vary at least from 2 inches to 17 inches, depending on the size of the inverter 10. In alternative embodiments, gas may enter the inverter 10 in other directions, such as radially from the sides of the inverter 10 and exit out through the gas exit.

The bottom up design of the inverter 10 within the inverter housing 12 may simplify assembly of the inverter 10 in the current embodiment, which will now be described in further detail. Components of the inverter 10 are stacked within the inverter housing 12 in the following order from the bottom up: capacitor 14, thermal barrier 16, flow guides 18, inverter cards 40, and fan mount 20. Alternative embodiments of the inverter 10 may be assembled differently, or in a different order, than that of the current embodiment.

The capacitor 14 of the inverter 10 may seat first within the inverter housing 12, mounting to a mounting surface of the inverter housing 12 near the bottom 30. The capacitor 14 may have an annular shape with a diameter slightly less than that of the inverter housing 12. As illustrated, the center of the capacitor 14 also includes a hole approximately 4 inches in diameter for gas to flow from the gas inlet to the gas exit of the inverter 10. The size of the hole through the capacitor may vary at least from 2 inches to 17 inches, depending on the size and configuration of the inverter 10. The number, size, shape, and configuration of the holes may vary from application to application. Capacitance of the capacitor 14 is selected to maintain the voltage applied to the load as the inverter cards 40 switch power to the load at the desired frequency and power level. For example, capacitance of the capacitor may range at least from 700 µF to 1000 µF, about 800 µF in the current embodiment.

The capacitor 14 may include electrical connectors for mating with each input or connector 44a-b of each inverter card 40. In this way, each inverter card 40 may have respective connections to the anode and cathode of the capacitor 14 such that DC(+) and DC(−) power is coupled to each inverter card 40.

The thermal barrier 16 seats between the capacitor 14 and the flow guides 18, and may thermal ground the inverter cards 40 from the capacitor 14. Similar to the capacitor 14, the center of the thermal barrier 16 may include a hole having a size selected to allow gas to flow from the gas inlet to the gas exit near the bottom 30 of the inverter 10. The thermal grounding function of the thermal barrier 16 may prevent heat from transferring via conduction, radiation, or both from the bottom 30 of the inverter 10 (which may be mounted to a heat source) to the inverter cards 40. For example, the thermal barrier may be in the form of a ceramic coating applied to a spacer structure mounted between the inverter cards 40 and the capacitor, or may be another form of thermal insulation.

The flow guides 18 seat between the thermal barrier 16 and the inverter cards 40, and, as will be described in further detail below, direct the gas over the inverter cards 40 and potentially reduce pressure drop in the inverter 10 from the gas inlet to the gas exit. The pressure drop from the gas inlet to the gas exit may affect fan or blower power requirements, and may be indicative of the cooling characteristics of the system. For example, one of the advantages of the current embodiment of the inverter 10 is a reduction in pressure drop from the gas inlet to the gas exit in order to improve gas cooling of the inverter cards 40.

Next, the nine inverter cards 40 are electrically mated to a mounting surface of the capacitor 14 and connected as described previously. Also, the fan mount 20 with fan mount center hub 26 may be mounted to the top 28 of the inverter housing 12, and a fan 6 or blower mounts to the fan mount 20, and may be selected to produce an appropriate amount of gas flow for cooling within power requirements.

Figure 2:
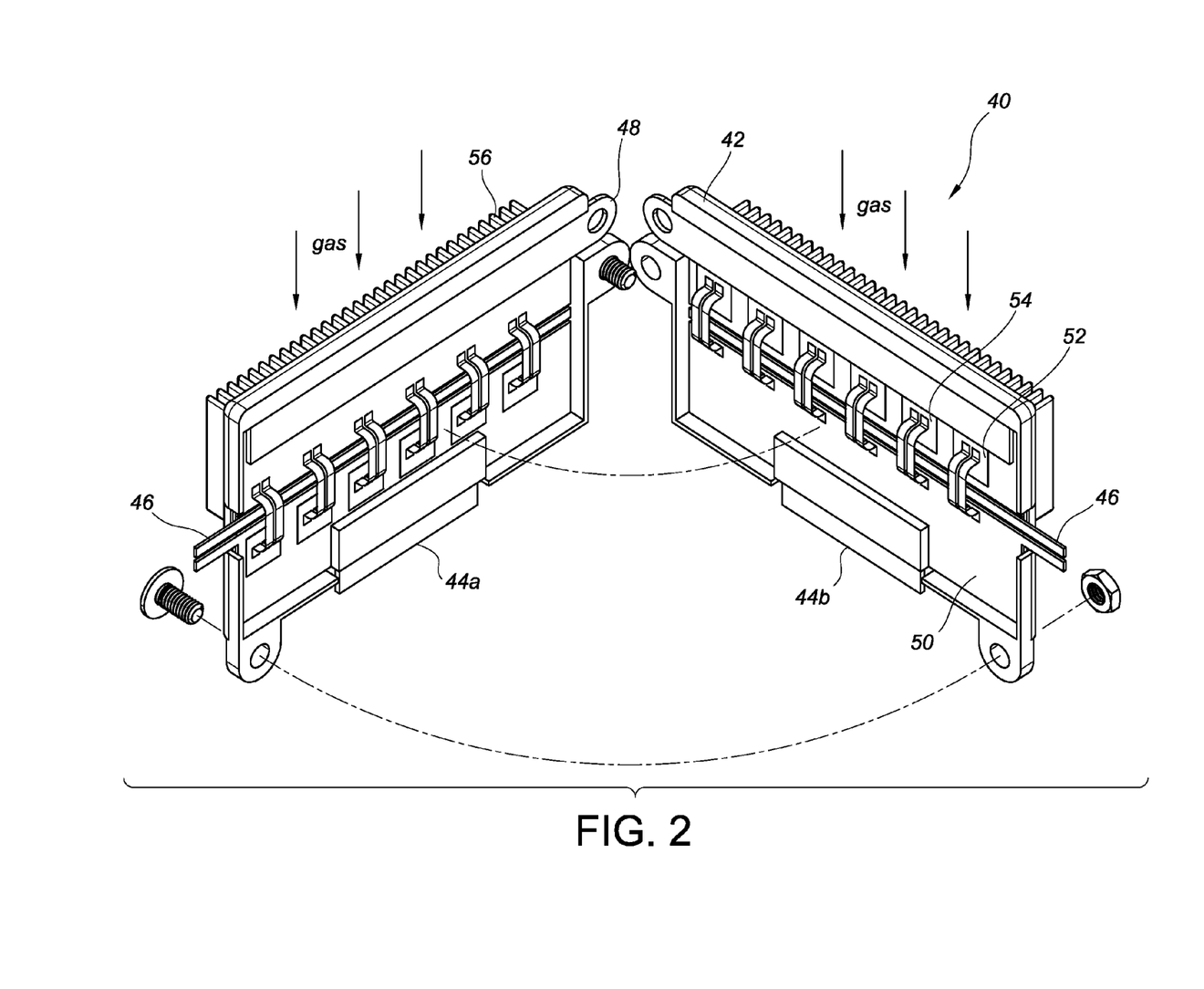
FIG. 2 is a partially exploded view of an inverter card according to the current embodiment.
Figure 3:
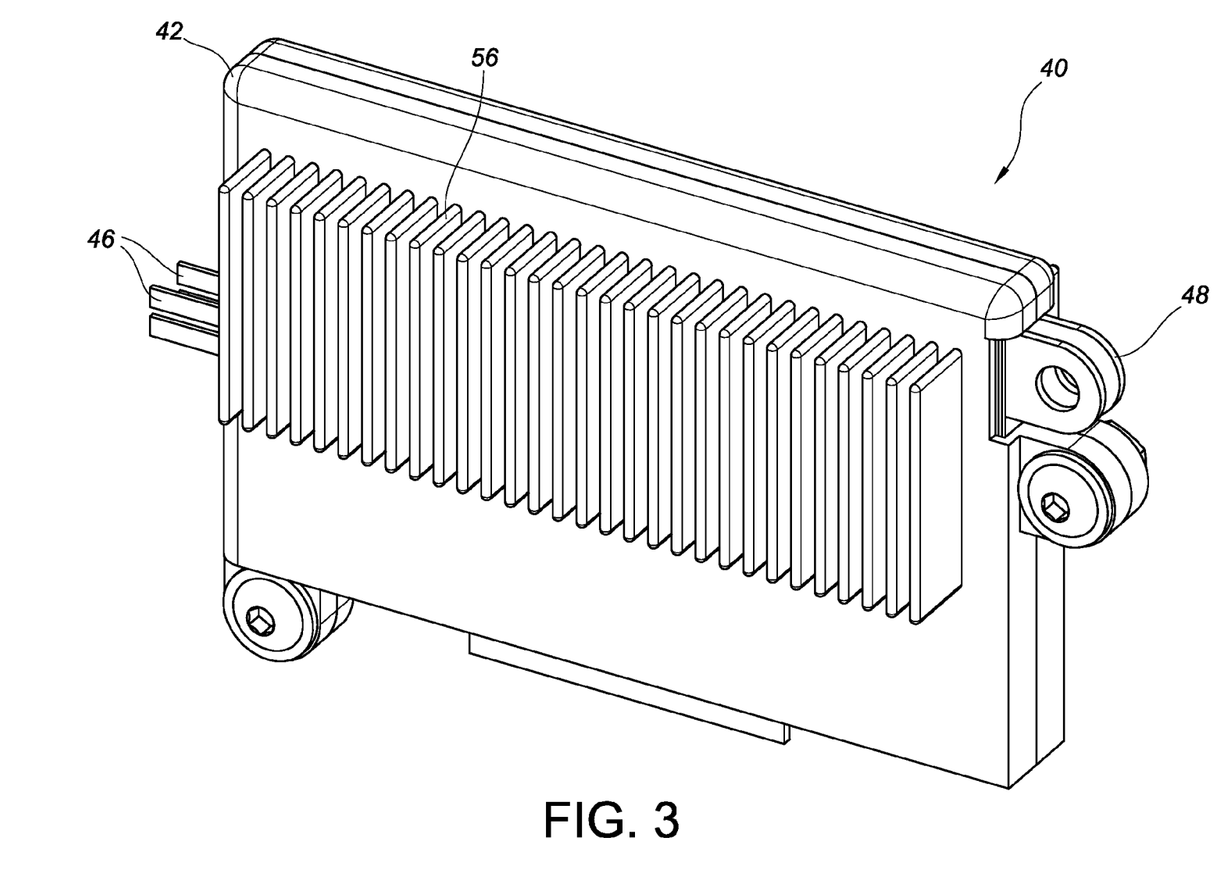
FIG. 3 is a perspective view of the inverter card according to the current embodiment.
Figure 4:
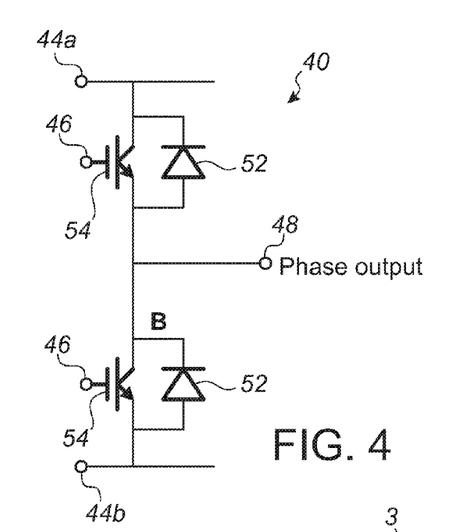
FIG. 4 is an illustration of the circuit topology of the inverter card according to the current embodiment.

Referring now to FIGS. 2-4, each of the inverter cards 40 includes heat transfer features 56 to enhance convection within the inverter 10. By dividing the inverter circuitry into multiple individual inverter cards 40 arranged roughly in parallel in the coolant flow path, heat generated from the circuitry may be distributed among the multiple cards in order to maintain temperatures below operating limits. Using this divided circuit structure, air or another coolant, such as another type of gas or a liquid, may be used to effectively cool the circuitry. Further, the modular structure of the inverter circuitry divided among multiple inverter cards 40 may allow for easy replacement of damaged or defective circuitry. In some embodiments, the circuitry for each inverter card 40 may be substantially similar such that the inverter cards 40 are interchangeable in their respective positions within the inverter 10, and such that one inverter card 40 may replace any of the other inverter cards 40 in the inverter 10. Accordingly, the modular structure of the inverter circuitry is not limited to an annular enclosure, and may be implemented in other enclosure designs or without an enclosure.

In the current embodiment, each inverter card 40 may include an encapsulation type structure or inverter card housing 42 to accommodate the heat transfer features 56 without exposing circuitry of the inverter card 40 to direct coolant flow. The heat transfer features 56 may include, for example, fins, pins, strips, or other structures that increase surface area of the inverter card housing and enhance convection. Fins, for instance, may have a thickness at least between 0.25 mm and 3 mm and a spacing at least between 1.0 mm and 4 mm, about having a 1.0 mm thickness and a 1.5 mm spacing for annular inverter configurations and a 1.0 mm thickness and a 2.0 mm spacing for a rectangular inverter configuration. Thickness and spacing are selected for the desired amount of heat dissipation.

In addition to heat transfer features 56 and inverter card housing 42, each inverter card 40 also may include a circuit card 50, DC(+) connector 44a, and DC(−) connector 44b, gate connections 46, phase out connector 48, diodes 52, and switches 54. The electrical schematic in FIG. 4 of the current embodiment of the inverter card 40 illustrates the overall architecture for the circuit topology of the inverter card 40. As illustrated, there is one high-side driver and one low-side driver, each including a switch 54 and a diode 52, and connected to the phase out connector 48. In some configurations, there may be a different number of drivers, such as three sets of high-side and low-side drivers in parallel having outputs connected to the phase out connector 48. The output of the phase out connector 48 may be controlled by gate drive circuitry (not shown) coupled to the gate connections 46 of each switch 54. DC power may be supplied to the inverter card 40 through DC(+) connector 44a and DC(−) connector 44b, which also may be electrically coupled to the capacitor 14. The switches 54 in the current embodiment are WBG Silicon Carbide MOSFET switches, and the diodes 52 are WBG Silicon Carbide diodes. Alternative embodiments may include different types of switches 54 and diodes 52 that have the capability to produce an appropriate output from the phase out connector 48. Further alternatives may include different circuitry divided among a plurality of encapsulated circuit cards for other applications outside the realm of traction inverters.

The circuitry of the inverter card 40—e.g., the diodes 52 and switches 54—may be mounted to direct bonded aluminum (DBA) traces of the circuit card 50. While the current embodiment uses DBA technology, other circuit card technology may be used with suitable thermal and electrical attributes, including direct bonded copper (DBC), for example. The circuit card 50 along with the diodes 52 and switches 54 may be housed in the void space of the inverter card housing 42, while the heat transfer features 56 reside on the outside of the inverter card housing 42 in the coolant flow field. Although dimensions of the circuit card 50, the diodes 52, and switches 54 in the current embodiment are listed in Table 1 below, the dimensions may vary depending on the circuitry and the desired heat dissipation characteristics.

TABLE 1

| Inverter Component | Dimensions (mm) |
|---|---|
| Switches 54 (MOSFETs) and Diodes 52 | 7.5 × 7.5 × 0.07 |
| Circuit Card 50, Al trace thickness | 0.58 |
| Circuit Card 50, AlN substrate thickness | 0.66 |

FIG. 2 illustrates the inverter card 40 of the current embodiment opened up into two sides, similar to a clamshell. Each half may include either the DC(+) connector 44a and DC(−)

connector 44b for mounting to the capacitor 14, and the switches 56 and diodes 54 may be alternately mounted to the circuit card 50. Around the perimeter of the circuit card 50, there may be a gap between the circuit card 50 and the inverter housing 42 to allow for thermal expansion of the circuit card 50. The gap may be between at least 5 mm and 0.5 mm, about 1 mm.

Although the divided nature of the inverter circuitry among the inverter cards 40 may improve heat dissipation characteristics of the inverter 10, the mass flow rate of coolant through the inverter 10 may also affect the heat dissipation characteristics of the inverter 10 and reduce the fan power requirements. Accordingly, optionally, the inverter 10 may be configured to reduce pressure drop through the system.

One indication of coolant gas flow through the inverter 10 is the pressure drop of the coolant through the inverter 10. Factors that may affect pressure drop through the system include the ratio of gas outlet area to the gas inlet area $$\left(\frac{A_{out}}{A_{in}}\right),$$

and the number of turns that the gas makes to exit the system. Simply increasing the gas outlet/inlet ratio may reduce pressure drop, as well as reducing the number of turns for the coolant gas or improving laminar flow. For example, axial inflow through the inverter 10 may have improved gas flow characteristics over a radial inflow configuration. Through empirical testing, the pressure drop through the current embodiment of the inverter 10 in an axial inflow configuration is approximately 11% less than the pressure drop of the inverter 10 in a radial inflow configuration.

Additional factors that affect the pressure drop through the inverter 10 include the heat transfer features 56 of the inverter cards 40, the flow guides 18, the fan mount center hub 26, and positioning of the tabs (not shown) of the capacitor 14. For instance, the inclusion of the heat transfer features 56 on the surface of the inverter cards 40 may increase pressure drop through the inverter. On the other hand, the flow guides 18 may decrease the pressure drop by directing the gas from the inlet to the exit, and by reducing unused space within the system in order to improve laminar flow. The fan mount center hub 26 may also direct the gas from the gas inlet over the inverter cards 40 toward the flow guides 18 in order to improve heat dissipation and decrease pressure drop through the system. Positioning the capacitor tabs out of the gas flow path also may contribute to decreased pressure drop.

Figure 8A:
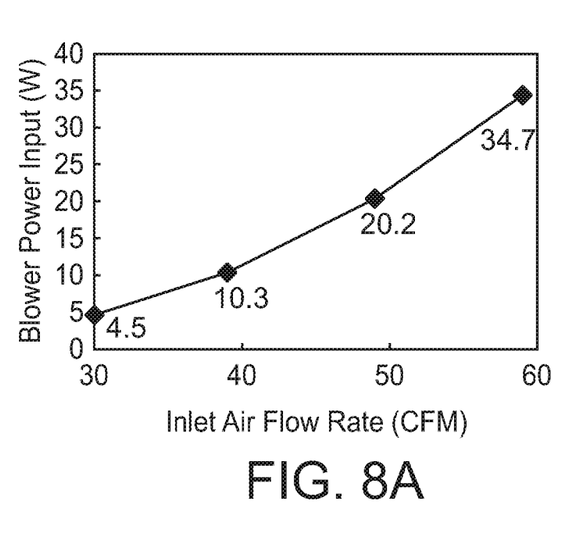
FIG. 8 are plots of the pressure drop and blower power input as a function of inlet gas flow rate for the inverter according to the current embodiment FIG. 9 are plots of the transient response of the inverter according to the current embodiment.
Figure 8B:
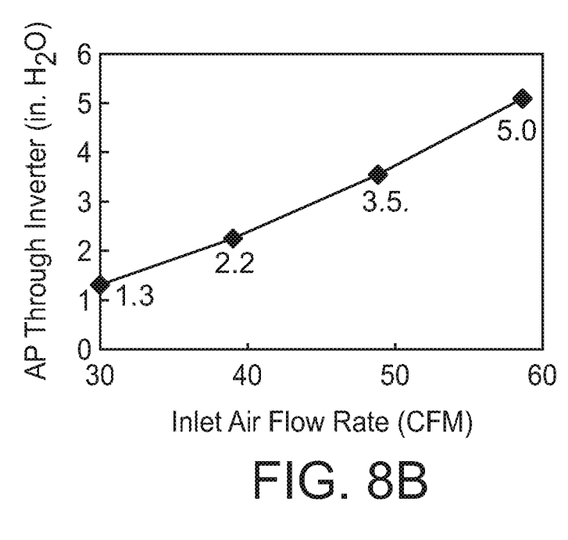
Figure 9A:
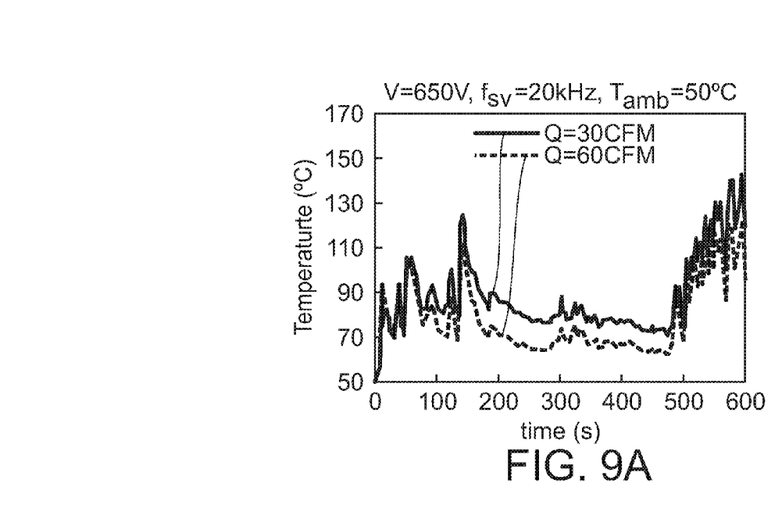
Figure 9B:
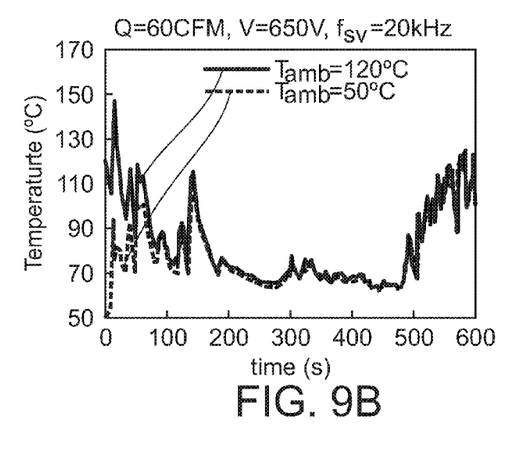
Figure 9C:
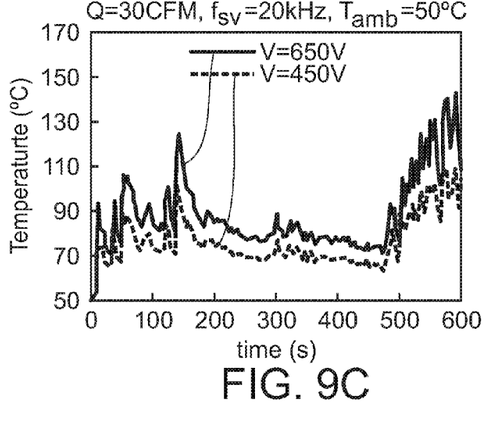
Figure 9D:
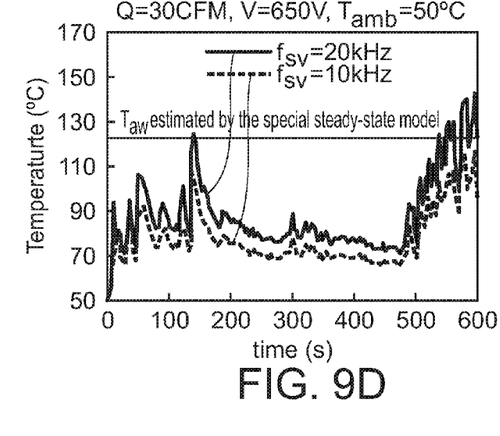
Figure 10A:
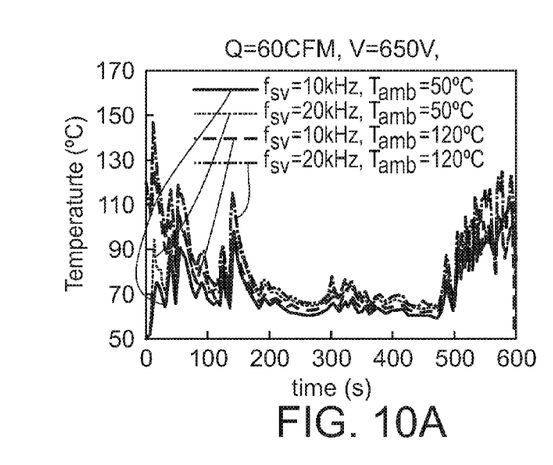
FIG. 10 are plots of the transient response of the inverter according to the current embodiment.
Figure 10B:
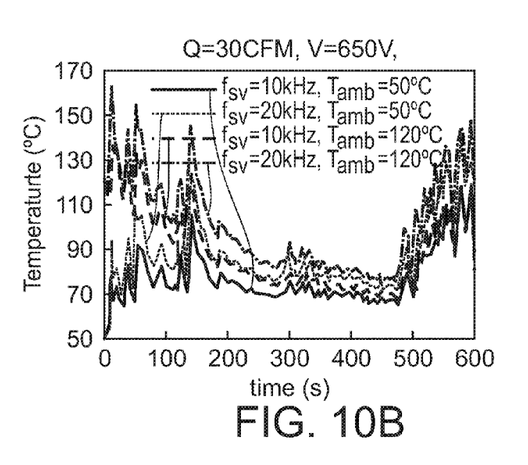
Figure 10C:
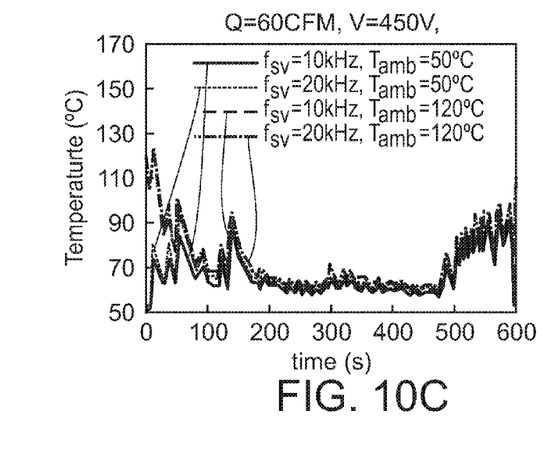
Figure 10D:
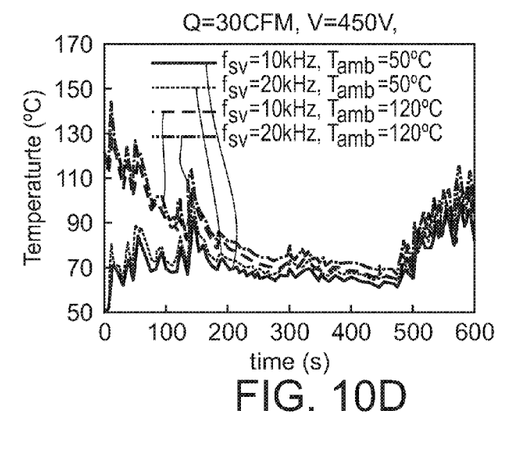

As previously discussed, the inverter 10 may be optionally configured to decrease pressure drop through the system. The pressure drop characteristics for an inverter 10 of the current embodiment configured accordingly, as tested, is illustrated in FIG. 8. The inverter 10 as tested was configured to include flow guides 18, capacitor tabs out of the gas flow path, heat transfer features 56 on the surface of the inverter cards 40, and an axial inflow design. The two charts of FIG. 8 illustrate pressure drop and blower power input as a function of inlet gas flow rate for the inverter 10, as tested. In alternative embodiments, some of the features described above for decreasing or increasing pressure drop may be included and others may not. For example, alternative embodiments of the inverter 10 may include a radial inflow design and flow guides 18 but not capacitor tabs out of the gas flow path.

A steady state response and a parametric transient response assessment of an annular inverter configuration, similar to the inverter 10 described above, was performed to simulate usage of the inverter system. The power dissipated from the switches 54 (e.g. SiC MOSFETS) and diodes 52 were evaluated within the models as a function of current, voltage, frequency, and device temperature. The results of the steady-state response assessment, using air as the coolant gas, a 650V DC power source, and a phase output of 240 A, are shown below in Table 2. Measurements for power dissipation ($\dot{E}_{gen}$) and junction temperature ($T_j$) of the switches 54 were taken as the coolant gas flow (Q) in cubic feet per minute (CFM) over the inverter card and the coolant gas temperature ($T_{inlet}$) were varied.

TABLE 2

| | $T_{inlet}$ (° C.) | | | |
|---|---|---|---|---|
| | 50 | 60 | 70 | 80 |
| Q = 50 CFM | | | | |
| $T_j$ (° C.) | 274 | 304 | 340 | 387 |
| $\dot{E}_{gen}$ (W) | 719 | 778 | 852 | 956 |
| Q = 60 CFM | | | | |
| $T_j$ (° C.) | 226 | 248 | 271 | 296 |
| $\dot{E}_{gen}$ (W) | 635 | 671 | 713 | 761 |

The transient response of the system was modeled with current as a function of time for two airflow rates of 30 CFM and 60 CFM, where 30 CFM represents the lower end of cooling capability and 60 CFM represents the higher end of cooling capability. The parameters used in the transient case were flow rate, system exterior temperature, voltage, and switching frequency. The results of the transient response of the current embodiment are illustrated in FIGS. 9 and 10, and Table 3 below includes the results for 16 different combinations of inverter frequency, voltage, ambient temperature, and airflow rate. As is apparent from the results, the junction temperature ($T_j$) at the end of the cycle may be lower than at the beginning of the cycle in cases in which $T_{in}$=120° C., and the maximum temperature at the end of the cycles may not exceed 164° C. For the input parameters described, the power density may be calculated to be 12.4 kW/L based on 650 V and 240 A.

TABLE 3

| | Input Parameters | | | | Results |
|---|---|---|---|---|---|
| | Q CFM | Tamb ° C. | V V | f kHz | Max Tj ° C. |
| 1 | 30 | 50 | 450 | 10 | 103 |
| 2 | | | | 20 | 108 |
| 3 | | | 650 | 10 | 116 |
| 4 | | | | 20 | 142 |
| 5 | | 120 | 450 | 10 | 142 |
| 6 | | | | 20 | 145 |
| 7 | | | 650 | 10 | 152 |
| 8 | | | | 20 | 164 |
| 9 | 60 | 50 | 450 | 10 | 92 |
| 10 | | | | 20 | 99 |
| 11 | | | 650 | 10 | 105 |
| 12 | | | | 20 | 121 |
| 13 | | 120 | 450 | 10 | 124 |
| 14 | | | | 20 | 125 |
| 15 | | | 650 | 10 | 133 |
| 16 | | | | 20 | 147 |

By comparing the steady state results and the transient results, it can be seen that (1) junction temperatures are high for steady state models with a current of 240 A, (2) the transient models include junction temperatures that are about 100° C., (3) for an ambient temperature of 50° C., the higher junction temperatures occur toward the end of the cycle, and (4) for an ambient temperature of 120° C. and inlet air temperature of 50° C., higher junction temperatures occur early in the cycle and decrease with decreasing current as a function of time.

Figure 6:
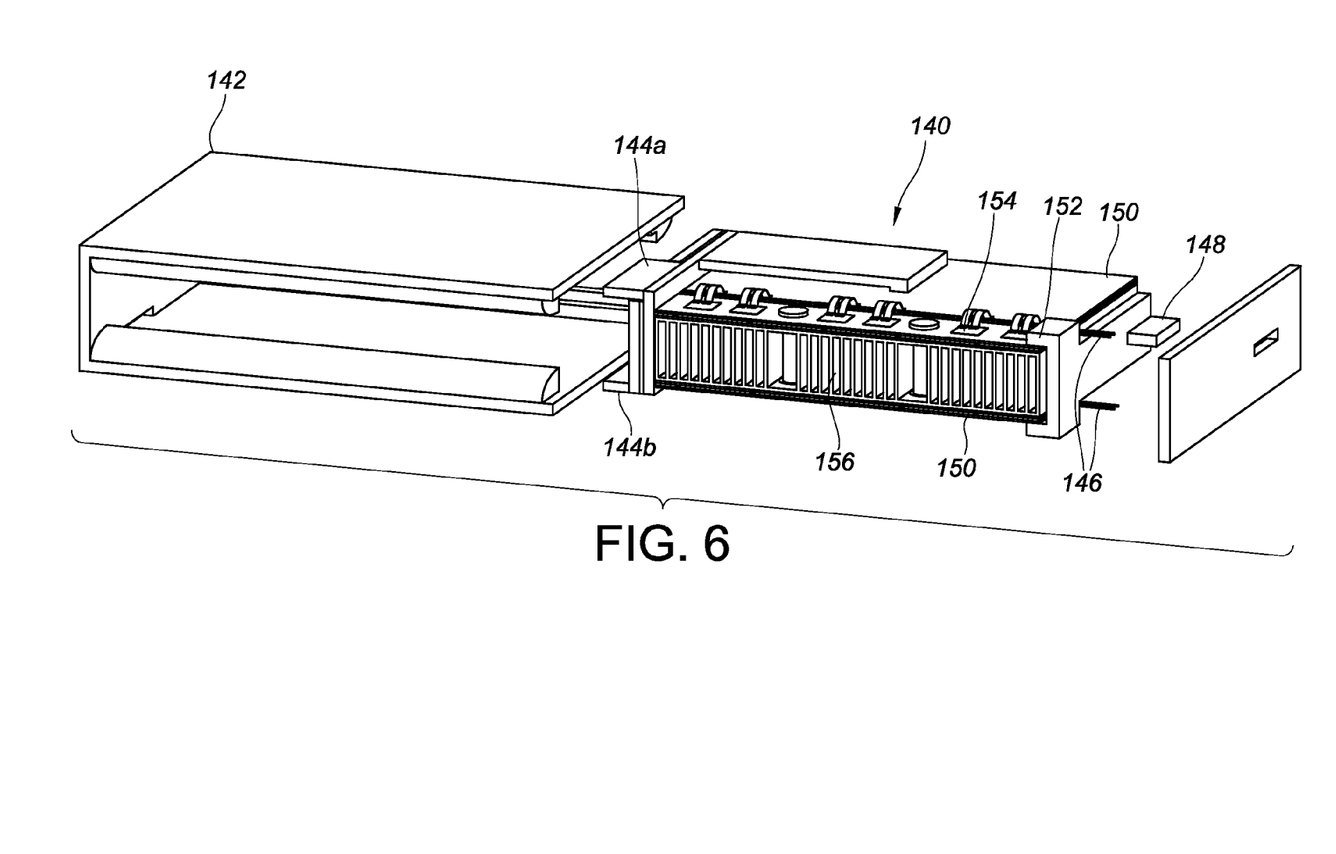
FIG. 6 is a perspective view of an inverter card according to a second embodiment.
Figure 7A:
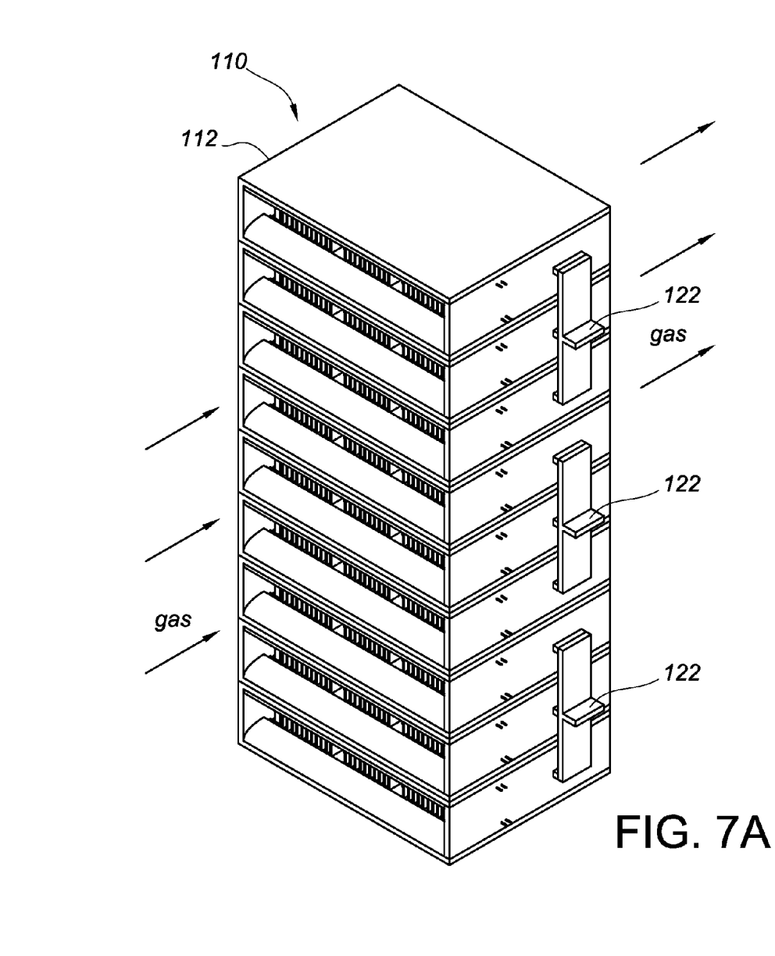
FIG. 7A is a perspective view of a rectangular inverter according to the second embodiment.
Figure 7B:
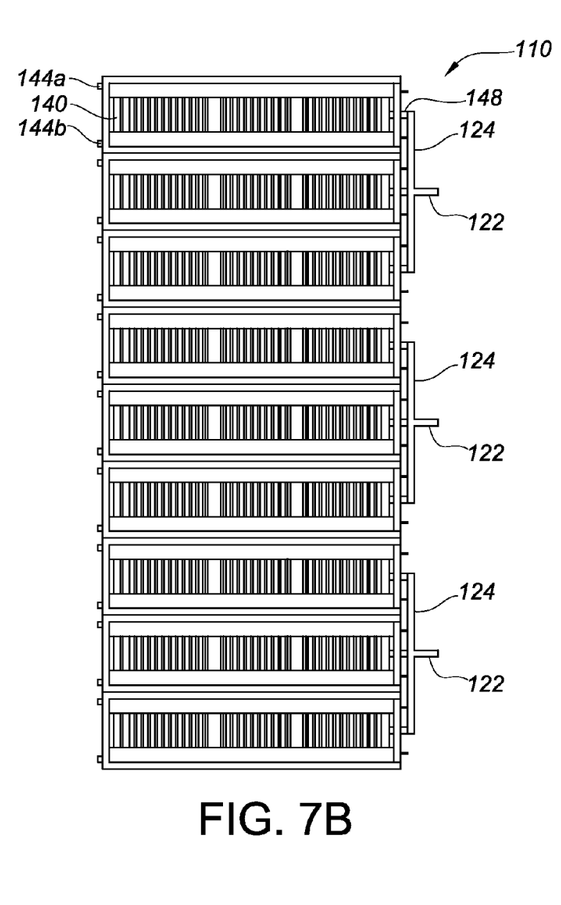
FIG. 7B is a perspective view of a rectangular inverter according to the second embodiment.

A second embodiment of the inverter is illustrated in FIGS. 6 and 7A-B. The inverter 110 of this embodiment is generally the same as the above embodiments as it includes circuitry divided among a plurality of inverter cards 140 to improve heat dissipation. The inverter 110 includes inverter housing 112, phase out external connectors 122, and phase out card connectors 124. However, there are several differences between this second embodiment and some of the embodiments described above. For example, rather than being positioned around an annular inverter, the inverter cards 140 in this embodiment are stacked alongside one another to form a series of coolant gas channels therebetween. In this way, the inverter 110 may form a rectangular construction of inverter cards 140 that allows heat to be carried away from the inverter cards 140.

The inverter card 140 in the second embodiment is similar to the inverter card 40, and includes heat transfer features 156, an inverter card housing 142, a circuit card 150, DC(+) connector 144a, DC(−) connector 144b, gate connections 146, phase out connector 148, diodes 152, and switches 154. However, there are some exceptions between this second embodiment and some of the embodiments of inverter 10 described above. For example, the heat transfer elements are internal to the housing 142 of inverter card 140 such that gas flows through the housing 142. Further, in embodiments where the heat transfer elements are fins, the fin thickness of heat transfer features 156 may be between at least 0.5 mm and 3 mm, about 1.0 mm, and the fin spacing of the inverter card 140 may be between at least 0.5 mm and 4 mm, about 2.0 mm.

As with the embodiments described above, coolant gas, such as air, may flow parallel with the inverter cards 140 in order to cool their components. The coolant gas in this embodiment may flow from left to right, or from right to left, in the illustrated direction with respect to the orientation of the inverter cards 140.

An inverter housing 112 supports each of the inverter cards 140 to maintain their spaced apart configuration and to protect them from shock and vibration, similar to embodiments described above. In this embodiment, the inverter cards 140 stack together to form the inverter housing 112, and include leads that connect to bus bars of the inverter housing 112. Alternatively, the inverter cards 140 may mate to a bus board of the inverter housing 112 using a DC(+) connector and DC(−) connector, similar to the DC(+) and DC(−) connectors 144a-b described above. In the second embodiment, the gate drive circuitry (not shown) and capacitor are located outside the inverter housing 112, but alternatively, either or both may be located within the inverter housing 112.

The above description is that of current embodiments of the invention. Various alterations and changes can be made without departing from the spirit and broader aspects of the invention as defined in the appended claims, which are to be interpreted in accordance with the principles of patent law including the doctrine of equivalents. Any reference to elements in the singular, for example, using the articles "a," "an," "the," or "said," is not to be construed as limiting the element to the singular.

The invention claimed is:

1. A gas-cooled converter comprising:
  a cylindrical housing having a central axis and a capacitor mounting surface;
  a cylindrical capacitor having a mounting surface and another surface, said another surface affixed to the capacitor mounting surface of the cylindrical housing such that the cylindrical capacitor is coaxial with the central axis;
  a plurality of converter circuit cards adapted to operate together to convert a power input to at least power output; and
  a plurality of circuit card housings, each of the plurality of circuit card housings enclosing one of the plurality of converter circuit cards, wherein the plurality of circuit card housings are adapted to dissipate heat from the plurality of converter circuit cards in response to gas flowing over the plurality of circuit card housings,
  wherein the plurality of circuit card housings are mounted to the mounting surface of the capacitor in a spaced apart configuration such that the plurality of circuit card housings are spaced around the mounting surface of the capacitor and each of the plurality of circuit card housings extends radially outward from the central axis.

2. The gas-cooled converter of claim 1 wherein each of the plurality of circuit card housings has heat transfer features for improving convective cooling of the plurality of converter circuit cards in response to the gas flowing over the plurality of circuit card housings.

3. The gas-cooled converter of claim 1 wherein the plurality of converter circuit cards are modular such that each of the plurality of converter circuit cards is interchangeable.

4. The gas-cooled converter of claim 1 wherein the cylindrical housing includes a gas inlet and a gas outlet adapted to allow the gas to flow in an axial direction substantially aligned with the central axis.

5. The gas-cooled converter of claim 1 wherein the cylindrical housing includes a gas inlet and a gas outlet adapted to allow the gas to flow radially inward toward a center of the cylindrical housing and exiting through the gas outlet in a direction substantially aligned with the central axis.

6. The gas-cooled converter of claim 1 wherein each of the plurality of circuit card housings closes about one of the plurality of converter circuit cards in a clamshell configuration.

7. The gas-cooled converter of claim 1 further comprising a fan for directing a flow of the gas over the plurality of circuit card housings in parallel with a major surface of each of the plurality of circuit card housings.

8. The gas-cooled converter of claim 1 further comprising a thermal barrier adapted to prevent heat transfer from an external heat source to the plurality of circuit card housings.

9. The gas-cooled converter of claim 1 wherein: the gas-cooled converter is an inverter; the plurality of converter circuit cards are adapted to operate together to convert the power input into three AC outputs for powering an electric motor of a vehicle; and the power input is a DC power input and the at least one power output comprises the three AC outputs.

10. A circuit component comprising:
  a cylindrical housing having a central axis and a capacitor mounting surface;
  a cylindrical capacitor having a mounting surface and another surface, said another surface affixed to the capacitor mounting surface of the cylindrical housing such that the cylindrical capacitor is coaxial with the central axis;
  a plurality of modular circuit cards adapted to form parts of a system of circuit cards, a first modular circuit card of the plurality of modular circuit cards being interchangeable with a second modular circuit card of the plurality of modular circuit cards, wherein the system of circuit cards produces an output; and a card housing supporting each of the plurality of modular circuit cards, wherein the card housing is adapted to dissipate heat from each of the plurality of modular circuit cards in response to gas flowing over the card housing, wherein each of the card housings is mounted to the mounting surface of the capacitor in a spaced apart configuration such that each of the card housings is spaced around the mounting surface of the capacitor and extends radially outward from the central axis.

11. The circuit component of claim 10 wherein the system of circuit cards forms a traction inverter for powering an electric motor of a vehicle.

12. The circuit component of claim 10 wherein each of the card housings encloses each of the modular circuit cards in a clamshell configuration, and includes heat transfer features adapted to improve convective cooling of each of the modular circuit cards in response to the gas flow.

13. The circuit component of claim 10 wherein each of the modular circuit cards is a modular inverter card adapted to produce a phase leg output of a three-phase inverter.

14. A traction inverter comprising:

a cylindrical housing having a central axis and a capacitor mounting surface;

a cylindrical capacitor having a mounting surface and another surface, said another surface affixed to the capacitor mounting surface of the cylindrical housing such that the cylindrical capacitor is coaxial with the central axis;

a plurality of modular inverter circuit cards adapted to operate together to supply AC power to an electric motor in a vehicle, the plurality of modular inverter cards being interchangeable with each other; and a plurality of circuit card housings having heat transfer features, each of the circuit card housings supporting one of the plurality of modular inverter circuit cards, wherein the heat transfer features are adapted to improve convective heat transfer between each of the modular inverter circuit cards and a gas coolant stream, wherein the plurality of circuit card housings are mounted to the mounting surface of the capacitor in a spaced apart configuration such that the plurality of circuit card housings are spaced around the mounting surface of the capacitor and each of the circuit card housings extends radially outward from the central axis, and wherein the gas coolant stream flows in an axial direction through the cylindrical housing and generally aligned with the central axis.

15. The traction inverter of claim 14 wherein each of the circuit card housings encloses the one of the modular inverter circuit cards in a clamshell configuration, and wherein the heat transfer features are at least one of fins, pins, or strips.

* * * * *